(12) United States Patent
D'Amore

(10) Patent No.: US 7,239,206 B2
(45) Date of Patent: Jul. 3, 2007

(54) ULTRACAPACITOR AUDIO AMPLIFIER

(75) Inventor: Anthony Thomas D'Amore, Chandler, AZ (US)

(73) Assignee: Rockford Corporation, Tempe, AZ (US)

( * ) Notice: Subject to any disclaimer, the term of this patent is extended or adjusted under 35 U.S.C. 154(b) by 174 days.

(21) Appl. No.: 11/112,511

(22) Filed: Apr. 22, 2005

(65) Prior Publication Data

US 2006/0238258 A1   Oct. 26, 2006

(51) Int. Cl.
*H03F 3/04*   (2006.01)

(52) U.S. Cl. ........................... 330/297; 330/127

(58) Field of Classification Search ............ None
See application file for complete search history.

(56) References Cited

U.S. PATENT DOCUMENTS

| 5,591,212 | A | 1/1997 | Keimel |
| 5,844,792 | A | 12/1998 | Moreau |
| 6,061,577 | A | 5/2000 | Andrieu et al. |
| 6,831,519 | B2 * | 12/2004 | Bar-David et al. .......... 330/297 |
| 6,836,097 | B2 | 12/2004 | Turner et al. |
| 2003/0169022 | A1 | 9/2003 | Turner et al. |
| 2004/0036499 | A1 | 2/2004 | Bal |
| 2006/0221516 | A1 * | 10/2006 | Daboussi ..................... 361/18 |

* cited by examiner

*Primary Examiner*—Khanh Van Nguyen
(74) *Attorney, Agent, or Firm*—Steptoe & Johnson LLP

(57) ABSTRACT

An amplifier that employs ultracapacitors to accommodate the peak power needs of an electrical system, such as car audio system. The amplifier operates off of a primary power source for average signal power levels and then uses the ultracapacitors when operating at peak power levels. As such, the amplifier can operate off of a primary power supply that supplies less than the peak power required by the amplifier.

16 Claims, 4 Drawing Sheets

ULTRACAPACITOR AUDIO AMPLIFIER

FIELD OF THE INVENTION

The present invention relates to the field of amplifiers, and more specifically to amplifiers configured to include ultracapacitors for power storage.

BACKGROUND OF THE INVENTION

Amplifiers are devices that accept a varying input signal and produce an output signal that varies in the same way as the input, but with a larger amplitude. The input and output signals may consist of a current, a voltage, a mechanical motion, or any other signal. An electronic amplifier is a device for increasing the power of a signal. It does this by taking power from a power supply and shaping the output to match the input signal. This process invariably introduces some noise and distortion into the signal, and the process is not completely efficient. Amplifiers always produce some waste as heat.

Different designs of amplifiers are used for different types of applications and signals. Amplifiers broadly fall into three categories: small signal amplifiers, low frequency power amplifiers, and RF power amplifiers. The most common types of amplifiers are electronic and have transistors or electron tubes as their principal components. Electronic amplifiers are widely used in consumer electronic devices, such as in radio and television transmitters and receivers, as well as audio and stereo systems.

Amplifiers in their simplest form are built around a single transistor. In one type of single-transistor amplifier, known as a common-emitter circuit, a varying input voltage is fed to the base of the transistor, and the output appears at the transistor's collector; the ratio of the output voltage to the input voltage is called the voltage gain. For many purposes a single transistor does not provide sufficient gain, or amplification. In a cascade, or multistage, amplifier, the output of the first amplifying device (transistor) is fed as input to the second amplifying device, whose output is fed as input to the third, and so on until an adequate signal amplification has been achieved. In a device such as a radio receiver, several amplifiers boost a weak input signal until it is powerful enough to drive a speaker. Usually, multistage amplifiers are not made of discrete components, but are built as integrated circuits. Another less common group of electronic amplifiers use magnetic devices as their principal components.

Amplifier circuits are classified as A, B, AB, and C for analog designs, and class D and E for switching designs. For the analog classes, each class defines what proportion of the input signal cycle is used to actually switch on the amplifying device. Class A amplifiers use all of the input signal. Class B amplifiers use half of the input signal. Class AB amplifiers use more than half of the input signal, but less than all of it. Class C amplifiers use less than half of the input signal.

Class A amplifiers are a fully linear amplifier with active circuit elements biased into their linear operating region. Class A amplifiers amplify over the whole of the input cycle. This means that the region must have enough voltage range to encompass the entire amplitude of an incoming signal in order to reproduce it without clipping or compressing at either extreme. They are the usual means of implementing small-signal amplifiers. They are not very efficient—a theoretical maximum of 50% efficiency is obtainable, but for small signals, this waste of power is small and tolerable. In a Class A circuit, the amplifying element is biased such that the device is always conducting to some extent, and is operated over the most linear portion of its characteristic curve (known as its transfer function or transconductance curve). Because the device is always conducting, even if there is no input at all, power is wasted. This is the reason for its inefficiency.

Class A designs are generally not preferred for audio power amplifiers, though some audiophiles believe that Class A gives the best sound quality due to its linear operation. In addition, some aficionados prefer vacuum tube designs over transistors, for a number of reasons. One is that the characteristic curve of a valve means that distortion tends to be in the form of even harmonics which, they claim, sound more "musical" than odd harmonics. Another is that valves use many more electrons at once than a transistor; thus statistical effects lead to a "smoother" approximation of the true waveform. Field-effect transistors have similar characteristics to valves, so these are found more often in high quality amplifiers than bipolar transistors. Historically, valve amplifiers often used a Class A power amplifier simply because valves are large and expensive; the Class A design uses only a single device. Transistors are much cheaper, so more elaborate designs that give greater efficiency but use more parts are still cost effective.

Class B amplifiers are somewhat more efficient than Class A amplifiers because they utilize two drive elements operating in a push/pull configuration. On the positive excursion of the signal, the upper element supplies power to the load while the lower is turned off. During negative excursions, the opposite operation occurs. This design increases operating efficiency, but suffers from the nonlinear turn-on, turn-off region created where the driver elements switch from their ON state to their OFF state. This switching error creates a condition commonly called cross-over distortion.

Class A/B: amplifiers remedy cross-over distortion to a great degree by combining the best features of both classes. The push/pull drivers are carefully biased just above their fully OFF state so that the transition between drivers is smoother. Therefore, each driver is never completely turned OFF. This alleviates most of the cross-over distortion at the expense of efficiency. An A/B amplifier is more efficient than a Class A amplifier.

Class C amplifiers are biased at or below cutoff. These amplifiers are often used for certain types of RF transmission, but are not commonly used in audio applications.

Amplifiers are an essential component in car audio applications. A stock car audio system refers to exactly what was specified by the manufacturer when the car was built. A custom car audio installation could mean anything from the upgrade of the radio to a full-blown customization of a car based around delivering exceptional sound quality or volume from audio equipment. The most common and familiar piece of audio equipment is the radio/tape player/CD player, which is generically described as a headunit. A recent development in headunit technology has been the addition of CD players with MP3 support.

High-end audio systems include component speakers that consist of a matched tweeter, mid-range and woofer set. These component pairs are available in two speaker and three speaker combinations, and include a cross-over which limits the frequency range that each component speaker must handle. In addition, a subwoofer(s) is provided for low frequency music information.

Amplifiers provide the necessary music power, measured in watts, to drive the speakers. High Power amplifiers require large gauge cable to provide adequate voltage and current to the amplifier. Alternators may be upgraded from the stock unit to increase the current capability of the vehicle's electrical system, often required of high-power amplifiers.

While the term car audio describes the sound system in an automobile, it also refers more broadly to the field of mobile entertainment and is becoming a sport at large. Many car audio enthusiasts enter their car audio systems into competitions, commonly known as "sound off" competitions. Organizations such as the International Auto Sound Challenge Association (IASCA) and the United States Autosound Competition International (USACI) sponsor and manage sound off competitions. There are two basic types of sound off competitions. One type is centered upon the Sound Quality (SQ) of a car audio system. The other type is based upon the Sound Pressure Level (SPL) of the car audio system.

In a sound pressure level competition, competitors are typically given 30 seconds in which to reach the maximum pressure level that their audio system can provide for a duration of around two seconds. This process of providing the maximum pressure level from the audio system for two seconds is referred to as "burping" the system.

Operating a high end car audio system in a competition, or for personal use, presents a variety of unique challenges. With a high end car audio system, an audio entusiast is trying to operate as much as a 10 kW amplifier off of a 12-volt car electrical system. Music has an average power level that is $1/8^{th}$ its maximum root mean square power. As such, a vehicle's electrical system must have the capacity to provide eight times its average power output to meet the peak power needs. For a 10 kW class amplifier, this means that the amplifier will use thousands of amps of current from the battery-supported low voltage car electrical system at a peak music power level. In order to accommodate this level of current use, auto enthusiasts will typically over-build their car audio system. For sound off competitions, competitors may have ten or more car batteries consuming the entire space of the trunk and multiple alternators connected to the engine.

Not only do car audio enthusiasts have to overbuild their car electrical system to handle these peak music power demands, they must also overbuild the electrical system to handle the inherent inefficiencies of the electrical system. In an electrical system, power is equal to the resistance times the square of the current ($P=ri^2$). When operating at an average music power level, a 10 kW system may use 100 amperes from the electrical system. At 100 amperes, a car electrical system having one milliohm of resistance would have a 10 W power loss. When operating at a peak music power level, a 10 kW system may use 1000 amperes from the electrical system. At 1000 amperes, a car electrical system having one milliohm of resistance would have a 1 kW power loss. This non-linear rise of power losses in relation to the current use forces one to operate an amplifier far below its rated capacity in a car electrical system.

There is therefore a great need to design an improved electrical system for car audio systems. There is a great need to provide a car audio system that can accommodate the peak power levels of music while still operating from a conventional car electrical system with few, if any, changes.

SUMMARY OF THE INVENTION

A preferred embodiment of the present invention is an amplifier that employs ultracapacitors. Ultracapacitors have storage capacities on the order of several farads with storage times of several seconds. The amplifier uses power from a primary power source on an averaging basis to amplify a signal. When the amplifier requires less than this average power level to amplify the signal, the excess power used from the primary power supply is used to charge the ultracapacitors. When the amplifier requires more than this average power level to amplify the signal, the ultracapacitors discharge to supplement the power used from the primary power source so that the signal is fully amplified. The use of these ultracapacitors enables the amplifier to amplify a signal fully over its entire amplitude range while relying on a primary power supply that may provide less power than is required to amplify the peak amplitude of the signal.

DETAILED DESCRIPTION OF PREFERRED EMBODIMENTS

Figure 1:
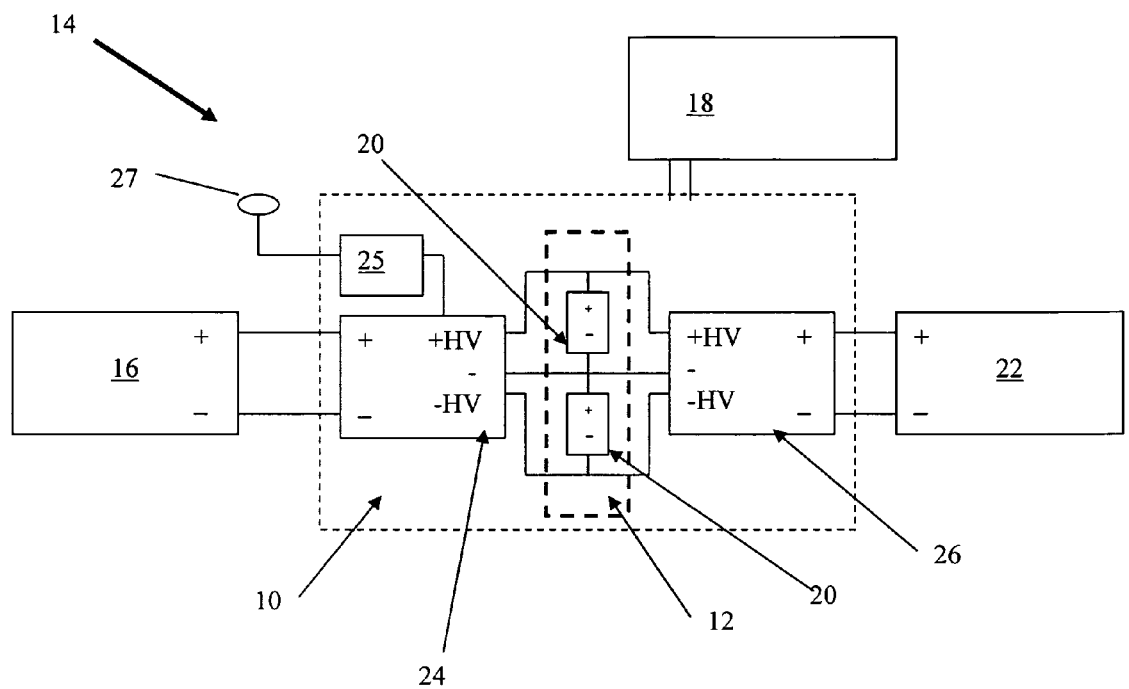
FIG. 1 illustrates a block diagram of an amplifier having an internal ultracapacitor power supply coupled with an electrical system.

Referring to the Figures by characters of reference, FIG. 1 illustrates a block diagram of an amplifier 10 having an ultracapacitor power supply 12 coupled with an electrical system 14 that includes primary power supply 16. Amplifier 10 may accept a varying input signal from signal source 18 and produces an output signal that varies in the same way as the input, but with a larger amplitude. Primary power supply 16 is configured to provide a level of power sufficient to supply at least the average power of the amplified output signal from amplifier 10.

Amplifier 10 includes an ultracapacitor power supply 12 that compliments primary power supply 16. Ultracapacitor power supply 12 includes a pair of ultracapacitors 20 in a parallel configuration. The use of two ultracapacitors 20 in a parallel configuration is merely exemplary. Ultracapacitor power supply 12 may include any number of ultracapacitors 20 in either serial, parallel, or hybrid configurations. In addition, ultracapacitor power supply 12 may include a single ultracapacitor 20. The requirements of amplifier 10 dictate the number, size, and configuration of ultracapacitors 20 used to form ultracapacitor power supply 12. Amplifier 10 preferably uses power from primary power supply 16 on an averaging basis instead of an instantaneous basis. By using current on an averaging basis, amplifier 10 will at times exceed or fall short of its instantaneous amplification power needs. Ultracapacitor power supply 12 is provided to take advantage of these periods where amplifier 10, by using power on an averaging basis, exceeds or falls short of its instantaneous power needs. When amplifier 10 requires less than this average power basis to amplify the input signal, the excess power used from primary power supply 16 is used to charge ultracapacitor power supply 12. When amplifier 12 requires more than this average power basis to amplify the input signal, ultracapacitor power supply 12 discharges to supplement the power used from primary power supply 16. The output of amplifier 10 is coupled to a load 22. Within amplifier 10 are an input section 24 and an output section 26.

Input section 24 preferably includes a voltage regulated power supply, such as one disclosed by U.S. Pat. No. 5,751,823 entitled "AUDIO AMPLIFIER SYSTEM WITH IMPROVED ISOLATION BETWEEN PREAMPLIFIER AND POWER AMPLIFIER," first named inventor James C. Strickland, issued on May 12, 1998, which patent is hereby incorporated by reference in its entirety including any appendices and references thereto. Input section 24 has a high voltage input section and a low voltage output section. Output section 26 has a high voltage DC input section and a high voltage AC output section. Ultracapacitor power supply 12 lies within the high voltage DC input section of amplifier 10.

Configuring amplifier 10 to use power from primary power supply 16 on an averaging basis and relying upon ultracapacitor power supply 12 for peak power needs has several advantages. Consider an amplifier that uses power from a primary power supply on an instantaneous basis. That primary power supply would have to have the ability to supply the maximum power required to amplify the peak amplitude of the input signal. In contrast, the inclusion of ultracapacitor power supply 12 alleviates the need to have a primary power supply that can supply the maximum power requires of amplifier 10. Instead, amplifier 10 only requires that primary power supply 16 provide sufficient power to meet its average amplification power requirements. As such, the inclusion of ultracapacitor power supply 12 allows for the use of a smaller primary power supply than as required if amplifier 10 used power on an instantaneous basis. As a result, primary power supply 12 is more efficient and cost effective.

Amplifier 10 that includes ultracapacitor power supply 12 may be used for any electrical system that requires amplification, such as civilian and military wireless communications, control systems, and consumer electronics. The amplification of music for home and car audio systems is one exemplary use of amplifier 10 that includes ultracapacitor power supply 12.

Voltage regulated power supply 24 includes a control unit 25. It is desirable to have the option to control and vary the charge rate of ultracapacitors 20. The charge rate of ultacapacitors 20 in ultracapacitor power supply 12 is directly proportional to $dV/dX$, where $dV=Vr-Vc$. Vr is the voltage regulation point of said power supply 24 and Vc is the voltage across ultracapacitors 20. X is a design value that may be varied by control unit 25. Varying X can either increase the performance, or increase the efficiency of operation of ultracapacitor power supply 12. When X is varied to enhance performance, the charge rate of ultracapacitors 20 is high, requiring a high output voltage from voltage regulated power supply 24. However, X can also be varied to enhance the efficiency of ultracapacitor power supply 12, whereby voltage regulated power supply 24 is operated at a lower voltage and ultracapacitors 20 charge at a slower rate. Control unit 25 may be connected to a wireless antenna 27, thereby enabling an operator to control the charge rate of ultracapacitors 20 via a wireless device.

Figure 2:
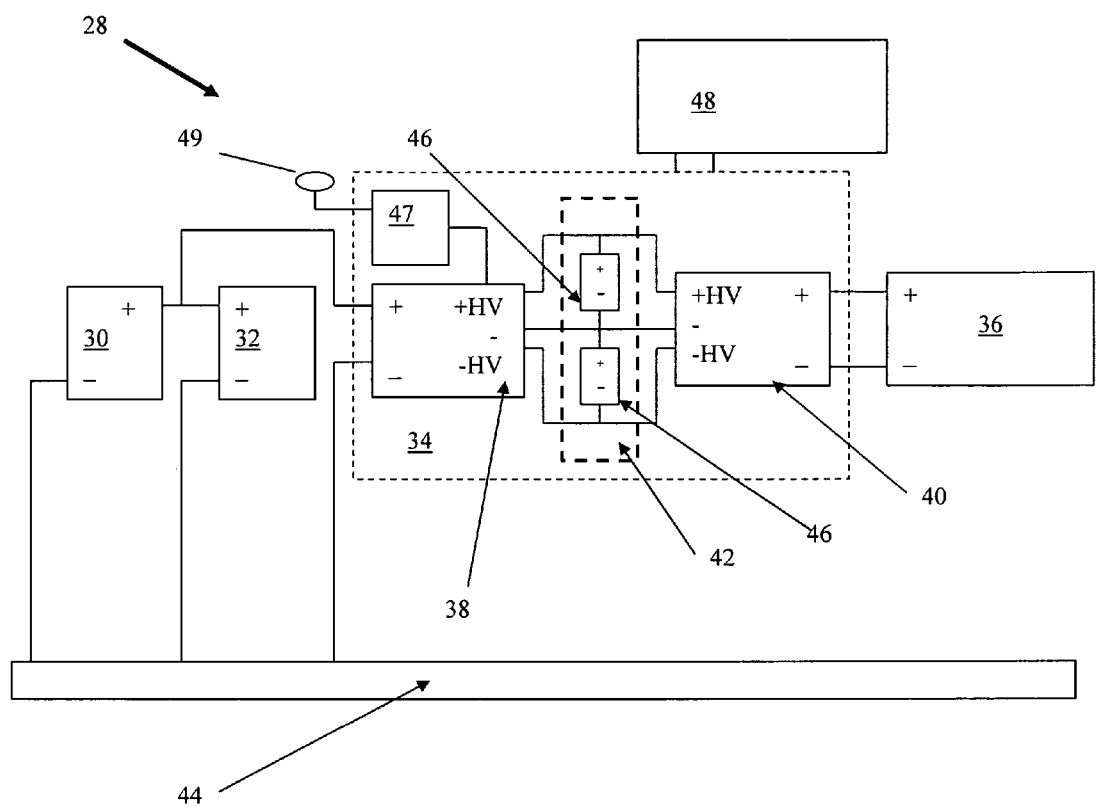
FIG. 2 illustrates a block diagram of an amplifier having an internal ultracapacitor power supply coupled with a car audio system.

FIG. 2 illustrates a block diagram of an ultracapacitor power supply 12 with a car audio electrical system 28 according to an embodiment of the invention. Car audio electrical system 28 includes a battery 30, an alternator 32, an amplifier 34, and a load 36. Load 36 is the output section of car audio system 28 that includes speakers. Amplifier 34 includes a voltage regulated power supply 38, an output section 40, and ultracapacitor power supply 42. Note that battery 30, alternator 32, and amplifier 34 are all grounded to the vehicle chassis 44. Ultracapacitor power supply 42 includes two ultracapacitors 46 in a parallel configuration. Again, the use of two ultracapacitors 46 in a parallel configuration for ultracapacitor power supply 42 is merely exemplary. Ultracapacitor power supply 42 can include any number of ultracapacitors 46 in any parallel, serial, or hybrid configuration as required for the amplification needs of audio electrical system 28. For instance, ultracapacitor power supply 42 may comprise a single ultracapacitor 46.

A preferred battery for battery 30 is a conventional twelve-volt car battery. Additional batteries 30 may be added to car audio electrical system 28 to provide more power to the system. Alternator 34 also generates power for car audio electrical system 28. Alternator 34 is preferably a conventional car alternator. Additional alternators 34 may be added to car audio electrical system 28 to provide more power.

Amplifier 34 utilizes battery 30 and alternator 32 to increase the power of the audio signal of a headunit 48, which is a radio, CD player, tape player, DVD player, MP3 player, or other consumer audio playback device. Amplifier 34 increases the power of the signal from headunit 48 by taking power from battery 30 and alternator 32 and shaping the output signal to match the input signal.

Amplifier 34 uses current from battery 30 and alternator 32 on an averaging basis, rather than an instantaneous one. Battery 30 and alternator 32 function as the primary power supply for amplifier 34. The input section of amplifier 34 is power supply 38. It is power supply 38 that uses current from battery 30 and alternator 32 on an averaging basis.

Headunit 48 emits a time varying electrical signal carrying music information. The average power of this signal is $\frac{1}{8}^{th}$ the maximum root mean square (RMS) power of the signal. Amplifer 34 increases the power of this electrical signal in order to drive load 36, which are the speakers. The level of power that amplifier 34 uses from battery 30 and alternator 32 on an averaging basis is the average power used by load 36. As headunit 48 emits the electrical signal carrying music information, amplifer 34 will at times require eight times the power that is supplied by battery 30 and alterantor 32 when the electrical signal is at its peak amplitude. Similarly, amplifier 34 will at times use more power from battery 30 and alternator 32 than is required to amplify the electrical signal when the electrical signal has a power less than its average power. Ultracapacitor power supply 42 supplements the power supplied by battery 30 and alternator 32.

When the power required to amplify the electrical signal from headunit 36 is less than the power used by amplifier 34 from battery 30 and alternator 32, the excess amount of power used from battery 30 and alternator 32 is used to charge ultracapacitor power supply 42. When the power required to amplify the electrical signal from headunit 48 is more than the power used by amplifier 34 from battery 30 and alternator 32, ultracapacitor power supply 42 discharges to supplement the power used from battery 30 and alternator 32 so that amplifer 34 may fully amplify the electrical signal. The addition of ultracapacitor power supply 42 enables amplifer 34 to run off of a primary supply, 30 and 32, that provides less than the maximum power required to amplify the peak amplitude of the electrical signal from headunit 48. The use of ultracapacitor power supply 42 enables the amplifier to operate with a high ratio of peak power to average power. This advantage afforded by the use of ultracapacitor power supply 42 becomes apparent when large power amplifiers are used in connection with high end car audio systems, particularly in mobile audio Sound Pressure Level competitions.

In mobile audio SPL competitions, the vehicle in competition is monitored by a sound pressure level meter. A competitor will play a sine wave signal on his audio system for one or two seconds at full power to achieve the highest sound pressure level possible. The competitor who achieves the highest SPL wins the competition.

The vehicles in these competitions have amplifiers that can produce well over 10 kW of power. When these amplifiers are operated on an instantaneous basis and acquire all of their power from the low voltage car power supply, the car power supply must have the ability to deliver eight times its average power output, reflecting the eight-to-one power variation of the electrical music signal. For amplifiers in the 10 kW+ class, this means periodically having to use thousands of amperes of current from the battery-supported, low voltage car electrical system. Consider a twelve-volt system with just 1 milliohm (1/1000 ohm) of resistance in its entire primary circuit. Due to $i^2r$ power losses rising with the square of current, the car audio system will experience a power loss of 10 W when the amplifier uses 100 amperes of current. This power loss reaches 1 kW when the amplifier uses 1000 amperes of current. This non-linear rise of losses forces one to install a 10 kW primary system to work at only $\frac{1}{8}^{th}$ of that power, on typical music content. In order to produce 10 kW of power on a car audio system, the vehicle may need to supply 12 kW–20 kW of power depending on the efficiency of the amplifier system. Generating this level of power on a low voltage electrical system is a challenge. Currently, the electrical systems in these type of vehicles usually consist of dozens of battery cells arranged in a series/parallel combination and one or more aftermarket high output alternators/generators to achieve approximately 16V with high current. 16V is preferable to power the 12V amplifiers due to the voltage drops throughout the system when 1000 amperes of current or more is required. An amplifier that could produce these same power levels, which averages the current use over a period of time, is greatly advantageous by reducing the peak current use on the vehicle's electrical system to a level that is much easier and efficient to support.

The inclusion of ultracapacitor power supply 42 facilitates the operation of high power amplifiers, such as a 10 kW class amplifier, off of a low voltage car electrical system without the addition of dozens of car batteries and high end alternators. Ultracapacitor power supply 42 allows amplifer 34 to use power from the car electrical system 28, battery 30 and alternator 32, on an averaging basis instead of an instantaneous one. As such, amplifier 34 may only use as little as $\frac{1}{8}^{th}$ of its peak power needs from the car electrical system, thereby allowing for the use of as little as one car battery and one alterantor to power amplifier 34. When the music signal has a power level below its average power level, amplifier 34 will use an amount of power from the car electrical system that exceeds the amount needed to amplify the signal. This excess power is used to charge ultracapacitor storage supply 42. When the music signal has a power level greater than its average power level, ultracapacitor power supply 42 discharges to provide the additional power needed to amplify the full amplitude of the music signal.

Voltage regulated power supply 38 includes a control unit 47. It is desirable to have the option to control and vary the charge rate of ultracapacitors 46. The charge rate of ultacapacitors 46 in ultracapacitor power supply 42 is directly proportional to dV/dX, where $dV=Vr-Vc$. Vr is the voltage regulation point of said power supply 38 and Vc is the voltage across ultracapacitors 46. X is a design value that may be varied by control unit 47. Varying X can either increase the performance, or increase the efficiency of operation of ultracapacitor power supply 42. When X is varied to enhance performance, the charge rate of ultracapacitors 46 is high, requiring a high output voltage from voltage regulated power supply 38. For instance, when a car enthusiast is competing in a sound off competition, he may desire to operate ultracapacitor power supply 42 at peak performance with ultracapacitors 46 having a maximum charge rate so that he may "burp" system 28 as many times as possible during his 30 second competition window. The high charge rate is desirable when seeking to achieve the highest SPL possible from system 28. However, X can also be varied to enhance the efficiency of ultracapacitor power supply 12, whereby voltage regulated power supply 38 is operated at a lower voltage and ultracapacitors 46 charge at a slower rate. An audio enthusiast may desire to operate ultracapacitor power supply 42 in this efficient mode when enjoying the sound quality of the music from system 28 and is not competing in a competition. This more efficient mode where ultracapacitors 46 charge at a lower rate is desirable when operating system 28 for a high SQ. Control unit 47 is connected to a wireless antenna 49, thereby enabling an operator to control the charge rate of ultracapacitors 46 via a wireless device and set system 28 for either a "competition" high SPL level or a "recreational" SQ level.

Figure 3:
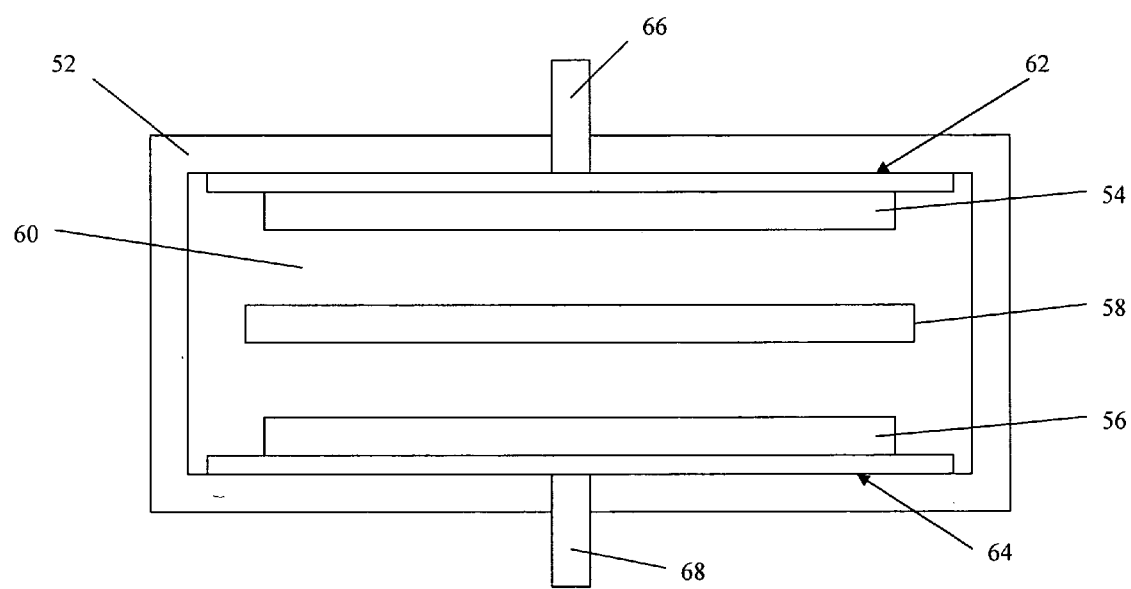
FIG. 3 illustrates an ultracapacitor.

FIG. 3 illustrates an exemplary ultracapacitor 50 that forms part of ultracapacitor power supply 12 and 42. Ultracapacitor 50 is encased within a nonconductive body 52. Ultracapacitor 50 includes a pair of carbon electrodes 54 and 56, an electronic porous separator layer 58, an electrolyte 60, a pair of conductive layers 62 and 64 that collect the current, and electrical leads 66 and 68. Electrical leads 66 and 68 extend from conductive layers 62 and 64 through body 52 and couple ultracapacitor 50 to voltage regulated power supply 24 and 38 and output section 26 and 40.

Ultracapacitors, also known as super or double-layer capacitors, represent a new generation of electrochemical components for energy storage. Capacitors are storage devices that store electrical energy on an electrode surface. Electrochemical cells create an electrical charge at electrodes by chemical reaction. An ultracapacitor is a charge storage device that stores energy by charge separation at an interface between electrode and electrolyte.

Ultracapacitors 50 are able to store more energy per weight than traditional capacitors and they typically deliver the energy at a higher power rating than many rechargeable batteries. Ultracapacitors 50 comprise two porous electrodes 54 and 56 that are isolated from electrical contact by a porous separator 58. Separator 58 and electrodes 54 and 56 are impregnated with an electrolytic solution 60, which allows ionic current to flow between the electrodes 54 and 56 while preventing electronic current from discharging ultracapacitor 50. Ultracapacitors 50 have no dielectric. On the back of each electrode is a current collector 62 and 64. One purpose of current collector 62 and 64 is to reduce ohmic loss.

When electric potential is applied to ultracapacitor 50, ionic current flows due to the attraction of anions to the positive electrode 54 and cations to the negative electrode 56. Upon reaching the electrode surface, the ionic charge accumulates to create a layer at the solid liquid interface region. This is accomplished by absorption of the charge species themselves and by realignment of dipoles of the solvent molecule. The absorbed charge is held in this region by opposite charges in the solid electrode to generate an electrode potential. This potential increases in a generally linear fashion with the quantity of charge species or ions stored on the electrode surfaces. During discharge, the electrode potential or voltage that exists across the ultracapacitor electrodes 54 and 56 causes ionic current to flow as anions are discharged from the surface of the positive electrode 54 and cations are discharged from the surface of the negative electrode 56 while an electronic current flows through an external circuit between electrode current collectors 62 and 64, such as amplifier 10 and 34.

Ultracapacitor 50 can be discharged and recharged repeatedly. Currently manufactured ultracapacitors are rated to withstand over 500,000 charge and discharge cycles without degradation. The double layer charge storage mechanism of an ultracapacitor is highly efficient and can produce high specific capacitance, up to several hundred Farads per cubic centimeter.

When used in conjunction with battery 30, ultracapacitor power supply 42 delivers peak power to amplifier 34 to reduce the required number of batteries 30, while minimizing battery discharge cycles to effectively extend battery life. By supplying peak load demands, ultracapacitor power supply 42 helps battery 30 last longer because it eliminates the repeated high power demands that are the primary cause of premature battery aging.

An exemplary ultracapacitor that is presently manufactured has a continuous operating voltage rating of 2.7 volts for over two seconds and capacitance voltage ratings ranging from 3 to 100 Farads. These ultracapacitors have a capacitance tolerance of ±20% and a surge voltage capability of 2.85V. These ultracapacitors have an operating temperature range of −40 to +60 C and a projected operating life of 10 years. Ultracapacitor 50 is merely an exemplary power storage device. Other power storage devices that are capable of supplying the peak rated power of an output section 22 or 36, such as a speaker system, may be used with this invention.

Most ultracapacitors have a maximum operating voltage range of 2.3V–2.7V. It is desirable to use ultracapacitors with the highest operating voltages as possible in order to minimize the number of ultracapacitors that are required for a particular application. The higher the operating voltage, the fewer the number of ultracapacitors that are required in series in order to obtain the high voltage requirements to generate high power levels. The capacitance of ultracapacitors currently available are in the range of less than 1.5 F to over 5000 F.

The total capacitance of a series network of ultracapacitors is the capacitance of one ultracapacitor divided by the total number of ultracapacitors. An exemplary audio amplifier may use 20 or more ultracapacitors in series. With an exemplary capacitance of 300 F per ultracapacitor, the capacitance of a block of 20 ultracapacitors in series is 15 F (The capacitance of twenty 2.7V–300 F ultracapacitors in series=300 F/20=15 F). The voltage of 20 ultracapacitors in series is equal to the number of ultracapacitors times the operating voltage of each ultracapacitor, which in this exemplary embodiment is equal to 2.7V×20=54V. It is desirable that the capacitance of the series network of ultracapacitors should be more than 10 F with a operating voltage of more than 2.3V in order to at least support the rated output power of a set of speakers for at least 0.5 seconds. In one exemplary design, ultracapacitor power supply 42 comprises two parallel networks of thirty 600 F ultrcapacitors in series, each for a net capacitance of 20 F at 81V, thereby supporting he rated output power of a set of speakers for at least 1.0 seconds.

Figure 4:
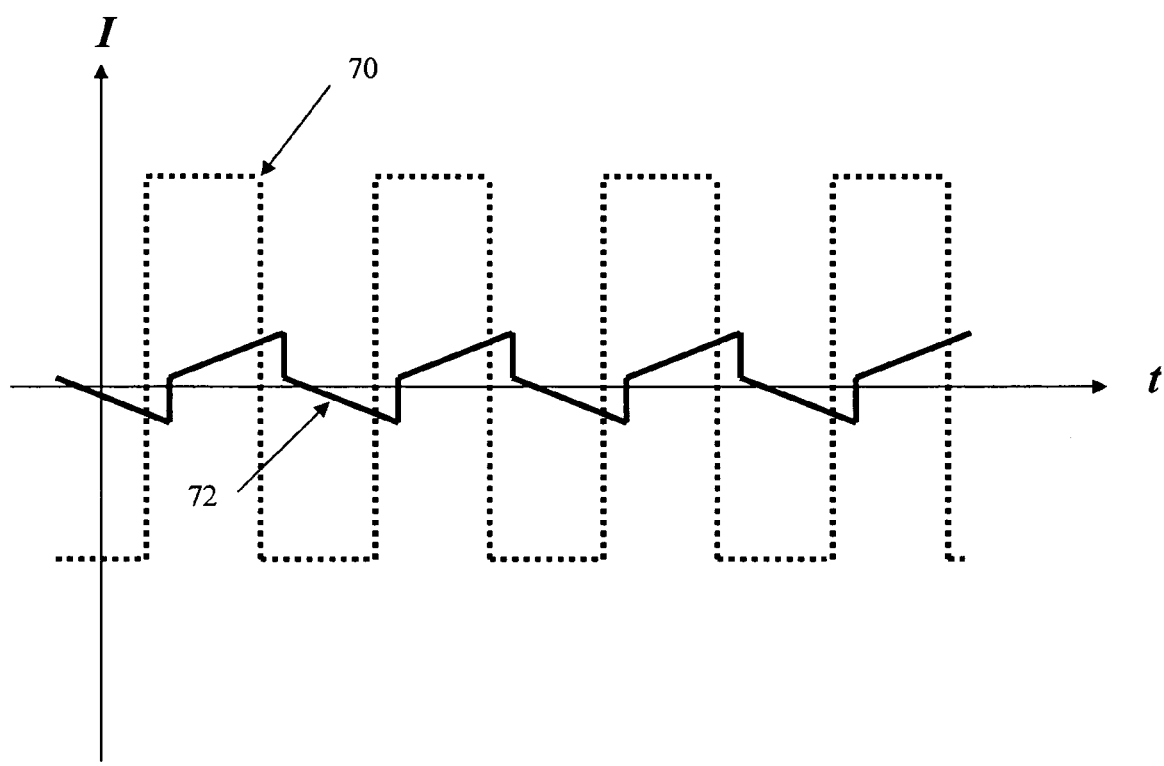
FIG. 4 illustrates a figure depicting the differing current use characteristics of an amplifier that includes an ultracapacitor power supply and an amplifier that does not include such an ultracapacitor power supply.

FIG. 4 illustrates a figure depicting the differing current use characteristics of an amplifier 10 and 34 that includes ultracapacitor power supply according to an embodiment of the invention and an amplifier that does not include such ultracapacitor power supply 12 and 42. The vertical Y axis of the figure is current and the horizontal X axis of the figure is time. Dashed line 70 represents the current use of an amplifier that does not include an ultracapacitor power supply 12 and 42. The input signal to this amplifier is a sine wave that is ON and OFF for equal periods of time, such as for example, two seconds. Solid line 72 represents the current flow of amplifier 10 and 34 that have ultracapacitor power supply 12 and 42 when given the same input sine wave. As depicted in the figure, the current flow of the amplifier is significantly reduced when ultracapacitor power supply 12 and 42 are included within amplifier 10 and 34. As amplifiers 10 and 34 that include ultracapacitor power supplies 12 and 42 use far less current, than those that do not include such ultracapacitors power supplies, amplifiers 10 and 34 are capable of operating off of a smaller power supply, thereby reducing cost to the overall system. In car audio systems, this lower level of current use 72 enables the use of powerful high end amplifiers in conjunction with a car's conventional electrical system without the need to overbuild the system to accommodate additional batteries and high end alternators.

Although a preferred embodiment of the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

What is claimed is:

1. An amplifier coupled to a power source and a load, said amplifier comprising:
   a power supply that forms an input section to said amplifier; and
   an internal ultracapacitor power supply, said amplifier using power from said power source on an averaging basis, said amplifier charging said internal ultracapacitor power supply when an instantaneous power usage of said amplifier is less than said averaging basis, said amplifier using power from said internal ultracapacitor power supply when said instantaneous power usage of said amplifier is more than said averaging basis.

2. The amplification system of claim 1, said power source supplying at least $\frac{1}{8}^{th}$ of the power consumed by said load when said load is operating at its full rated power.

3. The amplification system of claim 1, said internal ultracapacitor power supply storing energy sufficient to support rated output power of said load for at least 0.5 seconds.

4. The amplification system of claim 1, further comprising a control unit altering the voltage across said internal ultracapacitor power supply, thereby varying a rate at which said internal ultracapacitor stores a charge.

5. The amplification system of claim 1, said internal ultracapacitor power supply storing energy sufficient to support a rated output power within ±20 percent of the rated output power of said load.

6. An amplifier for amplifying a signal that uses power from a power source, said amplifier comprising:
   a voltage regulated power supply that uses current from said power source on an averaging basis;
   an ultracapacitor, said ultracapacitor stores a charge when said amplifier uses less than the averaging basis to amplify said signal, said amplifier uses power from said ultracapacitor when said amplifier's power needs exceed said averaging basis, said ultracapacitor coupled to said voltage regulated power supply; and an output section coupled to said ultracapacitor.

7. The amplifier of claim 6, said ultracapacitor stores energy sufficient to support a rated output power within ±20 percent of the rated output power of a load coupled to said output section.

8. The amplifier of claim 6, said voltage regulated power supply uses at least $\frac{1}{8}^{th}$ of the power consumed by a load from said power source when said load is operating at its full rated power.

9. The amplifier of claim 6, further comprising a control unit that alters the voltage across said ultracapacitor, thereby varying a rate at which said ultracapacitor stores said charge.

10. The amplifier of claim 6, said ultracapacitor stores energy sufficient to support rated output power of a load for at least 0.5 seconds.

11. A process for amplifying a signal for use by a load, comprising:

using a current from a power source on an averaging basis, said current is used by a voltage regulated power supply contained within said amplifier;

storing charge from at least a potion of said current in an ultracapacitor when an amplifier requires less than said current to amplify said signal; and using power from said ultracapacitor when said amplifier requires more power than provided by said current to amplify said signal.

12. The process of claim 11, said ultracapacitor is coupled to a high voltage output section of said voltage regulated power supply.

13. The process of claim 11, said averaging basis is $\frac{1}{8}^{th}$ the rated output power consumed by said load coupled to said amplifier.

14. The process of claim 11, said ultracapacitor stores sufficient energy to support rated output power of said load within ±20 percent.

15. The process of claim 11, further comprising altering a rate at which said ultracapacitor charges with a control unit.

16. The process of claim 11, said ultracapacitor stores energy sufficient to support rated output power of said load for at least 0.5 seconds.

* * * * *